US007013412B2

(12) United States Patent
Becker et al.

(10) Patent No.: US 7,013,412 B2
(45) Date of Patent: Mar. 14, 2006

(54) METHOD FOR SEGMENTALLY DEINTERLEAVING A DATA SIGNAL

(75) Inventors: Burkhard Becker, Ismaning (DE); Markus Doetsch, Schliern (CH); Peter Jung, Otterberg (DE); Jörg Plechinger, München (DE); Michael Schneider, München (DE); Tideya Kella, München (DE)

(73) Assignee: Infineon Technologies AG, Munich (DE)

(*) Notice: Subject to any disclaimer, the term of this patent is extended or adjusted under 35 U.S.C. 154(b) by 360 days.

(21) Appl. No.: 10/405,847

(22) Filed: Apr. 2, 2003

(65) Prior Publication Data

US 2003/0221157 A1 Nov. 27, 2003

Related U.S. Application Data

(63) Continuation of application No. PCT/DE01/03721, filed on Sep. 25, 2001.

(30) Foreign Application Priority Data

Oct. 2, 2000 (DE) ............................... 100 48 872

(51) Int. Cl.
*G11C 21/00* (2006.01)
*H03M 13/00* (2006.01)
*H03M 13/03* (2006.01)

(52) U.S. Cl. ..................... 714/702; 715/755; 715/786
(58) Field of Classification Search ................ 714/755, 714/786, 701, 702
See application file for complete search history.

(56) References Cited

U.S. PATENT DOCUMENTS

| 5,659,580 A | 8/1997 | Partyka ...................... 375/295 |
| 5,677,911 A | 10/1997 | Fimoff et al. ............... 714/701 |
| 6,029,264 A | 2/2000 | Kobayashi et al. ......... 375/348 |
| 6,108,388 A | 8/2000 | Douillard et al. ........... 714/755 |
| 6,396,423 B1 | 5/2002 | Laumen et al. ............... 341/95 |
| 6,493,815 B1 * | 12/2002 | Kim et al. ................... 711/217 |
| 6,631,491 B1 * | 10/2003 | Shibutani et al. ........... 714/762 |

FOREIGN PATENT DOCUMENTS

| DE | 198 46 721 A1 | 4/2000 |
| WO | WO 99/07076 | 2/1999 |

OTHER PUBLICATIONS

Raouafi, F. et al.: "Saving Memory in Turbo-Decoders Using the Max-Log-MAP Algorithm", The Institute of Electrical Engineers, IEE, Savoy Place, London, 1999, pp. 14/1-14/4.
Jung, P.: "Analyse und Entwurf digitaler Mobilfunksysteme" [Analysis and Design of Digital Mobil Radio Systems], B G. Teubner Verlag, Stuttgart, Appendix E, 1997, pp. 343-368.

* cited by examiner

*Primary Examiner*—Albert Decady
*Assistant Examiner*—Esaw Abraham
(74) *Attorney, Agent, or Firm*—Laurence A. Greenberg; Werner H. Stemer; Ralph E. Locher

(57) ABSTRACT

In a method for deinterleaving a data signal interleaved in blocks in accordance with a prescribed interleaving specification, deinterleaving target addresses are calculated for a first prescribed segment of the data symbols to be deinterleaved, and are stored in a target address memory. The relevant segment of the data symbols is then deinterleaved by using the calculated target addresses. Subsequently, these two steps are repeated until the entire data block has been segmentally deinterleaved.

6 Claims, 4 Drawing Sheets

METHOD FOR SEGMENTALLY DEINTERLEAVING A DATA SIGNAL

CROSS-REFERENCE TO RELATED APPLICATION

This application is a continuation of copending International Application No. PCT/DE01/03721, filed Sep. 25, 2001, which designated the United States and was not published in English.

BACKGROUND OF THE INVENTION

Field of the Invention

The invention relates to a method for deinterleaving a data signal interleaved in blocks.

In telecommunications engineering, it is customary to interleave a data signal, which will be transmitted via a channel, at the transmitter end. As a result of the interleaving, interference that without interleaving would effect detection errors that are statistically dependent (occurring in groups) instead produces statistically independent detection errors. For statistically independent detection errors, by using channel coding a better degree of error protection can be achieved than for statistically dependent detection errors.

The interleaving and deinterleaving of the data signal is performed in data blocks. That is to say a respectively identical interleaving specification is used by the interleaver at the transmitter end to interleave data block by data block, and in the deinterleaver at the receiver, which deinterleaves using the inverse deinterleaving specification (likewise identical in each case).

For this purpose, it is necessary for the appropriate target addresses (interleaving target addresses or deinterleaving target addresses) to be calculated for resorting the data symbols before the first interleaving or deinterleaving. To date, this has been done in such a way that before carrying out the first interleaving or deinterleaving procedure, target addresses are calculated for all of the data symbols of a data block, and are stored in an interleaving target address memory or deinterleaving target address memory. In the case of a data block consisting of K data symbols, the target address memories must in each case include K target address memory locations. The target address memories therefore contain the complete interleaving and deinterleaving information.

It is disadvantageous in this method of deinterleaving that a large memory location area must be set up in the receiver. For the UMTS (Universal Mobile Telecommunications System) Standard, which permits a data block length K of between 40 and 5114 bits, a memory with 5114 memory locations with an address data width of 13 bits is required to store the deinterleaving target addresses.

Usually, the deinterleaving of a data signal is performed after the channel coding. In the case of a special form of channel coding, which is denoted as turbo coding, an interleaving procedure is carried out as early as during the channel coding. This interleaving carried out in the course of turbo coding is denoted below as turbo interleaving.

Turbo codes are binary, parallel-concatenated, recursive, systematic convolutional codes. Particularly in the case of the transmission of large data blocks consisting of more than, for example, 1000 bits, the use of turbo codes can achieve a substantially better degree of error protection than is possible with conventional convolutional codes. The structure of a turbo code and the generation of the turbo code by using a turbo coder with an integrated turbo interleaver are known and are described in detail, for example, in the book entitled "Analyse und Entwurf digitaler Mobilfunksysteme" ["Analysis and design of digital mobile radio systems"], by P, Jung, Stuttgart, B. G. Teubner-Verlag, 1997, Appendix E, pages 343–368.

Upon the reception of the turbo-coded data signal transmitted via a transmission channel (for example mobile radio channel), it is necessary for the turbo interleaving also to be cancelled in the receiver in the course of turbo decoding. This process is denoted as turbo deinterleaving and is accomplished by using a turbo deinterleaver integrated in the turbo decoder.

The turbo interleaving and deinterleaving of the data signal is likewise performed in data blocks.

International Publication WO 99/07076 describes an interleaving method in the case of which the interleaving addresses are calculated directly by using a controller as a function of various algorithmic specifications. The inverse deinterleaving process is intended to be implemented in the reverse sequence.

U.S. Pat. No. 5,677,911 specifies a method for segmental deinterleaving of a previously interleaved data stream. The segmental deinterleaving is achieved by virtue of the fact that the time delays of data words undertaken in the interleaving are cancelled in the deinterleaving operation.

U.S. Pat. No. 6,108,388 describes an interleaving method in the case of which, as in the UMTS Standard, both an inter-row permutation and an intra-row permutation are undertaken.

SUMMARY OF THE INVENTION

It is accordingly an object of the invention to provide a method for deinterleaving a data signal interleaved in blocks, which overcomes the above-mentioned disadvantages of the prior art methods of this general type.

In particular, the deinterleaving method is to have a memory location requirement that is as low as possible.

It is also an object of the invention to provide an improved method for turbo deinterleaving a data signal interleaved in blocks.

With the foregoing and other objects in view there is provided, in accordance with the invention, a method for deinterleaving a data signal. The method includes a step of: obtaining the data signal, which has been interleaved in blocks in accordance with a prescribed variable interleaving specification obtained from a generating rule prescribed in UMTS Standard TS 25.212 for calculating various interleaving specifications. Each one of the blocks includes K data symbols. The method then includes steps of: without previously calculating target addresses for interleaving, calculating deinterleaving target addresses for a first prescribed segment of the K data symbols of a data block directly from the generating rule, and storing the deinterleaving target addresses of the first prescribed segment of the K data symbols in a target address memory; and deinterleaving the first prescribed segment of the K data symbols in accordance with the deinterleaving target addresses stored in the target address memory. All remaining segments of the data block are segmentally deinterleaving by: a) without previously calculating target addresses for interleaving, calculating new deinterleaving target addresses for a next prescribed segment of the K data symbols of the data block directly from the generating rule, and storing the new deinterleaving target addresses in the target address memory, b) deinterleaving the next segment of the K data symbols of the data block in accordance with the new deinterleaving target addresses stored in the target address memory, and c) repeating steps a) and b) for each one of the remaining segments of the data block.

Accordingly, the invention relates to a method for deinterleaving a data signal interleaved in blocks in accordance with a variable interleaving specification. The interleaving specification to be applied follows from the generating rule, prescribed in the UMTS Standard TS 25.212, for calculating the various interleaving specifications and the block length K.

Each data block is successively deinterleaved by calculating deinterleaving target addresses from the generating rule, without previously calculating the target addresses for the deinterleaving, first only for a predetermined segment of the data block, and subsequently carrying out a deinterleaving of the corresponding segment of the (interleaved) data block received. This operation is repeated until the entire data block has been deinterleaved segment by segment. The memory location requirement is substantially reduced in this way in the case of deinterleaving, because only the deinterleaving target addresses of data block segments need be stored, and not those of the entire data block.

Consequently, an advantageous refinement of the invention is characterized in that the deinterleaving target addresses calculated in the next step are stored by overwriting the target addresses previously stored in the target address memory.

A further advantage is achieved by virtue of the fact that the precalculation of the deinterleaving target addresses for the segments of data symbols is undertaken directly from the generating rule without previously calculating target addresses for the interleaving. Because of the omission of the calculation of the interleaving target addresses, a further reduction is achieved in the memory location requirement for the deinterleaving.

The generating rule is the UMTS Standard TS 25.212, which defines, for each data block length K, a turbo interleaving specification in the form of a coordinate transformation matrix including R rows and C columns. In this case, each of the prescribed segments of a data block can have a number of nz·C consecutive data symbols of the interleaved data signal, in which nz is a whole number equal to or greater than 1.

It is preferred that nz=1, that is to say turbo deinterleaving of the data block is undertaken in rows.

Other features which are considered as characteristic for the invention are set forth in the appended claims.

Although the invention is illustrated and described herein as embodied in a method for segmentally deinterleaving a data signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
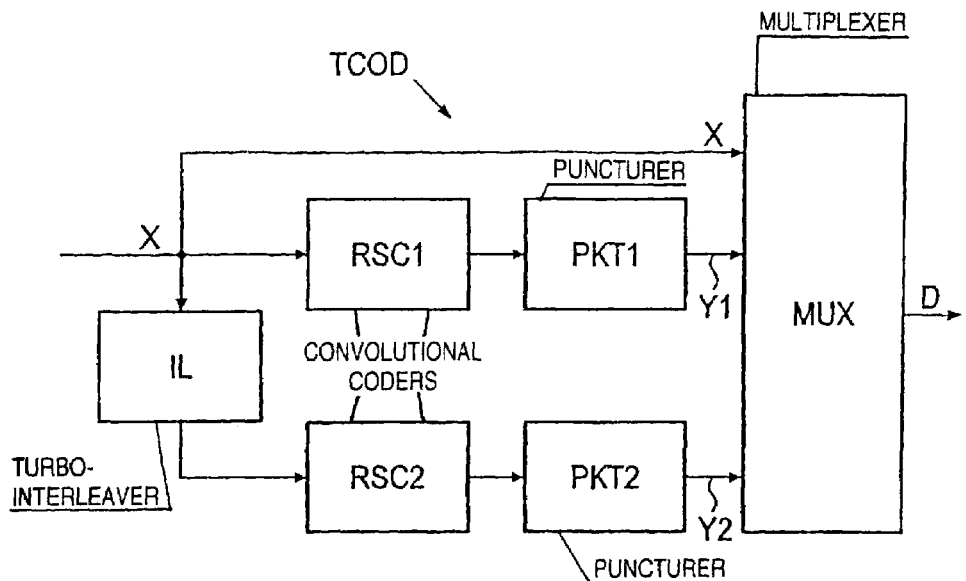
FIG. 1 is a block diagram of a known turbo coder for generating a turbo code.

Referring now to the figures of the drawing in detail and first, particularly, to FIG. 1 thereof, there is shown by way of example, a block diagram of a turbo coder TCOD that can be used in a UMTS transmitter for generating a turbo-coded data signal D. Other turbo coders can also be used within the scope of the invention.

The turbo coder TCOD has a turbo interleaver IL, two identical, recursive, systematic convolutional coders RSC1 and RSC2 (for example 8-state convolutional coders), two optional puncturers PKT1 and PKT2, and a multiplexer MUX.

The task of the turbo coder TCOD is to add redundancy to a digital input signal X for the purpose of error protection coding. The input signal consists of a sequence of data symbols, for example bits. The digital input signal X can be, for example, a source-coded voice or video signal.

The turbo coder TCOD generates a digital output signal D that is generated by multiplexing the input signal X (so-called systematic signal), a signal Y1 coded by RSC1 and, if appropriate, punctured by PKT1, and a signal Y2 interleaved by IL, coded by RSC2 and, if appropriate, punctured by PKT2.

The turbo interleaver IL carries out interleaving of the input signal X in blocks. That is to say, in constant repetition, the turbo interleaver IL respectively receives K data symbols (K is a whole, positive number and denotes the data block length), resorts them, and outputs them again in changed sequence. The resorting (permutation) of the data symbols is performed using a specification that is always the same for a constant data block length K.

The block length K is variable in the UMTS Standard and is between 40 and 5114 bits. As will be explained later in further detail, a special interleaving specification is prescribed in the standard for each data block length.

The error-protection-coded data signal D is then modulated in a suitable way onto a carrier and transmitted via a transmission channel (for example mobile radio channel).

The decoding of a turbo-coded received signal in a receiver is explained below with reference to the known turbo decoder TDEC shown in FIG. 2. Other designs of turbo decoders are also possible, and can be used to carry out the inventive method.

The turbo decoder TDEC includes a first and a second demultiplexer DMUX1 and DMUX2, a memory MEM, a first and second convolutional decoder DEC1 and DEC2, a turbo interleaver IL', a first and a second turbo deinterleaver DIL1 and DIL2, and a decision logic element (threshold discriminator) TL.

An equalized data sequence $\hat{D}$ that is the coded data sequence D reconstructed in the receiver is provided by a demodulator (not illustrated) of the receiver.

Figure 2:
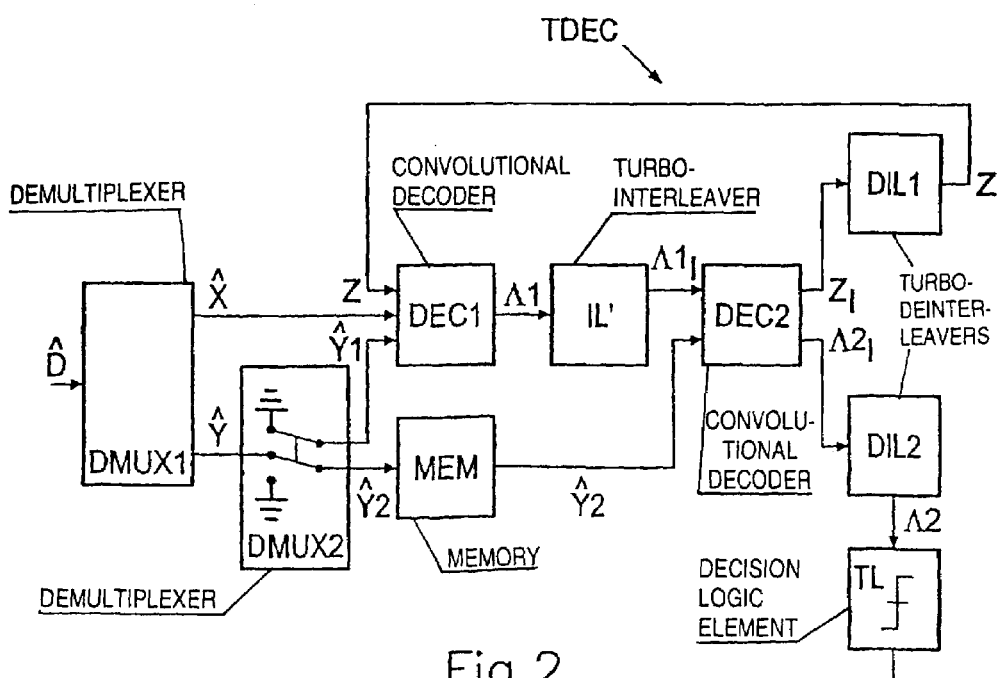
FIG. 2 is a block diagram of a known turbo decoder for decoding a turbo-coded received signal.

The mode of operation of the turbo decoder TDEC shown in FIG. 2 is explained briefly below.

The first demultiplexer DMUX1 splits the equalized data signal $\hat{D}$ into the equalized systematic data signal $\hat{X}$ (reconstructed version of the input signal S) and an equalized redundancy signal $\hat{Y}$. The latter is split by the second demultiplexer DMUX2 into the two equalized redundancy component signals $\hat{Y}1$ and $\hat{Y}2$ (reconstructed versions of the redundancy component signals Y1 and Y2).

The two convolutional decoders DEC1 and DEC2 can be MAP symbol estimators, for example. Starting from the data signals $\hat{X}$ and $\hat{Y}1$ and a feedback signal Z, the first convolutional decoder DEC1 calculates logarithmic reliability data $\Lambda 1$ in the form of LLRs (Log-Likelihood Ratios).

The reliability data $\Lambda 1$ are interleaved by the turbo interleaver IL', and the interleaved reliability data $\Lambda 1_I$ are fed to the second convolutional decoder DEC2. The modes of operation of the turbo interleavers IL and IL' are identical. The second convolutional decoder DEC2 uses the interleaved reliability data $\Lambda 1_I$ and the reconstructed redundancy component signal data $\hat{Y}2$, which are already in the memory MEM, to calculate an interleaved feedback signal $Z_I$ and interleaved second logarithmic reliability data $\Lambda 2_I$, likewise in the form of LLRs.

The interleaved feedback signal $Z_I$ is deinterleaved by the first turbo deinterleaver DIL1 and produces the feedback signal Z.

The recursion loop illustrated is run through several times (for example 5 times). Each pass is based on the data of the same data block. The interleaved second reliability data $\Lambda 2_I$ obtained in the last pass are deinterleaved by the second deinterleaver DIL2 and fed as deinterleaved reliability data $\Lambda 2$ to the decision logic element TL. The latter thereupon determines a data signal E(X) that is a sequence of estimated values for the data symbols of the input signal X.

The next data block is turbo-decoded after the turbo decoding of a data block and the outputting of the corresponding sequence of estimated values E(X).

A detailed description of the mode of operation of a turbo decoder is specified in chapter E.3.3 "Rekursive MAP-Symbolschätzung" ["Recursive MAP symbol estimation"] of the book by P. Jung on pages 353 to 361, which is hereby incorporated into this document.

As may be seen by way of example from the turbo decoder TDEC illustrated in FIG. 2, a turbo decoding includes with each loop pass a turbo interleaving procedure (IL') and a turbo deinterleaving procedure (DIL1) as well as a final turbo deinterleaving procedure (DIL2). The two turbo deinterleaving procedures are identical.

The interleaving specification can be described mathematically by a permutation. The permutation uniquely assigns each output or source address, a target address for resorting the data symbols of a data block. The source address is the original position of the data symbol in the data block, and the target address is the position of the resorted data symbol in the interleaved data block.

Figure 3:
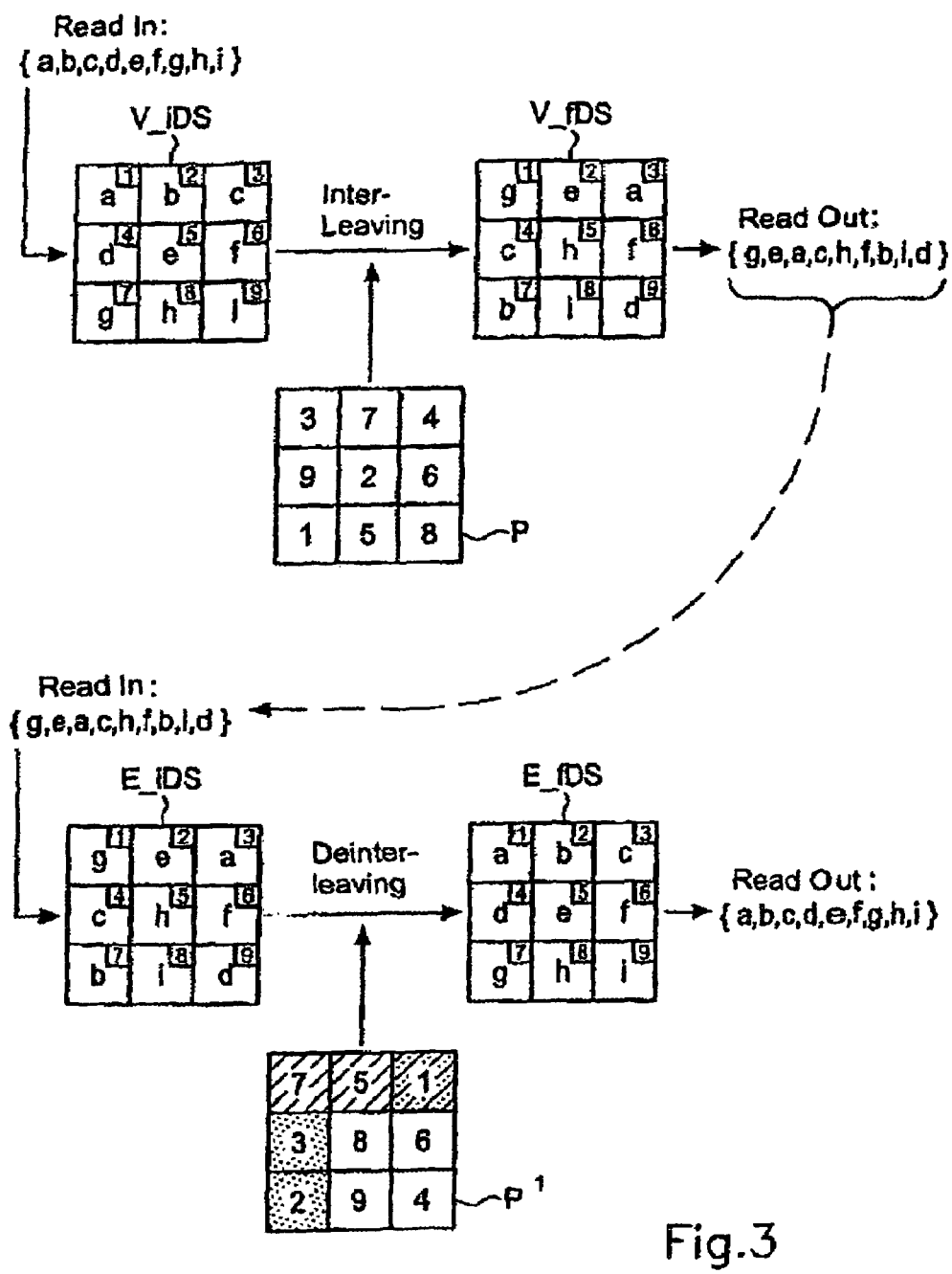
FIG. 3 is an illustration for explaining an interleaving permutation matrix and the inverse permutation matrix as well as the inventive principle of segmental turbo deinterleaving.

The basic principle of the invention is explained in FIG. 3 using a simple example.

First, the interleaving operation is considered. A data sequence forming a data block and including K=9 data symbols {a,b,c,d,e,f,g,h,i} is to be interleaved. The upper part of FIG. 3 shows an interleaving input data memory V_iDS, represented as a 3×3 memory location matrix, an interleaving output data memory V_fDS, represented as a 3×3 memory location matrix, and a 3×3 permutation matrix P whose elements are likewise stored in a memory (target address memory).

The data sequence is read into the interleaving input data memory V_iDS and is stored there, as illustrated in FIG. 3, in the row direction.

The memory locations of the data memory V_iDS and V_fDS are enumerated in the row direction with addresses n=1 to 9. The addresses n are entered in the right-hand upper corner of the respective memory locations.

For the data symbol stored in the interleaving input data memory V_iDS in the memory location with address n, the permutation matrix P specifies the interleaving target address V-Adr(n) in the interleaving output data memory V_fDS. During interleaving, therefore, the data symbol stored in V_iDS at memory location 1, specifically a, is stored in V_fDS at the memory location 3, the data symbol stored in V_iDS at the memory location 2, specifically b, is stored in V_fDS at memory location 7, . . . etc. The interleaving output data memory V_fDS is likewise read out in the row direction, that is to say the interleaved data sequence is [g,e,a,c,h,f,b,i,d].

In accordance with the lower part of FIG. 3, the deinterleaving is carried out in a way analogous to the interleaving, but using the inverse permutation matrix (the term inverse relates to the operation of sequential execution of permutations), denoted as $P^{-1}$. The inverse permutation matrix $P^{-1}$ is specified in FIG. 3. The elements of the inverse permutation matrix are stored in a deinterleaving target address memory.

It is now assumed that the interleaver is to be capable of executing a multiplicity of different interleaving specifications. In this case, the aim is not to keep the diverse interleaving specifications ready in the form of a multiplicity of permutation matrices stored in the interleaver, but rather it is assumed below that a special generating rule exists that can be used to build up the various permutation matrices as a function of one or more generating parameters (for example the data block length K). As further set forth below, these presuppositions are met in the case of the turbo interleaving in accordance with the UMTS Standard.

The conventional mode of procedure for carrying out the deinterleaving is as follows: first, in accordance with the generating rule, the desired permutation matrix P is calculated completely (that is to say all the interleaving target addresses). Then the completely calculated permutation matrix P is inverted. The deinterleaving is then undertaken using the inverted permutation matrix $P^{-1}$.

The inventive procedure in the case of the turbo deinterleaving is distinguished from the conventional mode of procedure in that first only a specific, prescribed segment of the inverse permutation matrix $P^{-1}$, for example, the deinterleaving target addresses E-Adr(n)=7,5,1 specified in the first row (illustrated by dashes), are determined for n=1,2,3. Subsequently, that is to say before the determination of further deinterleaving target addresses, a first partial deinterleaving of the interleaved data signal is undertaken. In this case, the first three data symbols g,e,a of the interleaved data sequence, which are stored in the deinterleaving input data memory E_iDS (corresponds to V_fDS) at the first three memory locations, are written into the memory locations 7,5,1 of the deinterleaving output data memory E_fDS. Subsequently, a further prescribed segment of the inverse permutation matrix $P^{-1}$, for example the deinterleaving target addresses 3,8,6 specified in the second row, is calculated. The writing operation relevant to this is then carried out. This mode of procedure is continued until the interleaved data sequence is completely deinterleaved.

In other words, neither the permutation matrix P nor, from the latter, the inverse permutation matrix $P^{-1}$ is calculated completely. Rather, in each case only the matrix elements (deinterleaving target addresses) of the inverse permutation matrix $P^{-1}$ that are precisely required for deinterleaving the prescribed segment of the interleaved data block are calculated. In this case, the small memory location requirement for storing the deinterleaving target addresses in the deinterleaving target address memory is advantageous, since the target addresses used in the preceding deinterleaving step can be overwritten in each deinterleaving step. In the case of the example explained (that is to say in the case of deinterleaving in rows), the deinterleaving target address memory must include not nine but only three memory locations.

It may be noted that the possibility of being able to use the generating rule to calculate the interleaving permutation matrix P deliberately for specific, prescribed segments does not imply that it is also possible to calculate the inverse permutation matrix $P^{-1}$ segmentally with reference to prescribable segments. If, for example, the interleaving target addresses of the first row of the permutation matrix P are calculated, the result is the values 3,7,4. These values can be used to calculate the addresses 1,2,3 of the inverse permutation matrix $P^{-1}$ (represented by dots), which are not, however, sufficient for deinterleaving a prescribed segment of data symbols, for example, the data symbols stored in the first row of the memory E_iDS. This example makes it clear that even when it should be possible to calculate the permutation matrix P segmentally, it is generally first necessary to calculate the complete permutation matrix P in order to calculate a prescribed segment of the inverse permutation matrix $P^{-1}$.

A possibility for partially calculating the inverse permutation matrix $P^{-1}$ (deinterleaving target address matrix) is specified below for the case of the UMTS Standard. The realization that such a segmental calculation of the inverse permutation matrix $P^{-1}$ is possible in the UMTS Standard is part of the invention.

As already mentioned, the UMTS Standard specifies a generating rule that can be used to generate a special interleaving specification for each possible block length K. Each interleaving specification is specified in the form of a coordinate transformation between the deinterleaving input data memory E_iDS and the deinterleaving output data memory E_fDS.

For the purpose of better understanding of the invention, the generating rule agreed in the UMTS Standard TS 25.212 V3.3.0 is first reproduced below for the purpose of determining the associated coordinate transformation matrix. The coordinate transformation matrix contains the same information as the permutation matrix explained using FIG. 3, but differs from the latter in that the permutation specification is represented in the form of a two-dimensional coordinate transformation (and not of a one-dimensional target address allocation specification).

1st Step (Definition of the Transformation Matrix)
   1.1 Definition of the number R of the rows:
   R=5, if K=40 to 159 bits (case 1)
   R=10, if K=160 to 200 bits or K=481 to 530 bits (case 2)
   R=20, otherwise (case 3)
   1.2 Definition of the number C of the columns:
   Case 2, for K=481 to 530 bits: C=p=53
   otherwise:
   (i) search for the minimum prime number p such that $$0 \leq (p+1) - K/R$$

(ii) if $0 \leq p - K/R$, then go to (iii)
   otherwise: C=p+1

(iii) if $0 \leq p - 1 - K/R$, then: C=p−1
   otherwise: C=p
   1.3 The input data sequence is then written line for line into an R×C input data memory matrix (corresponds to V_iDS).

2nd Step (Intra-Row Permutation)
   Case A: C=p
   (A1) Selection of a primitive root g from the following table:

| p  | g | p  | g | p   | g | p   | g  | p   | g |
|----|---|----|---|-----|---|-----|----|-----|---|
| 7  | 3 | 47 | 5 | 101 | 2 | 157 | 5  | 223 | 3 |
| 11 | 2 | 53 | 2 | 103 | 5 | 163 | 2  | 227 | 2 |
| 13 | 2 | 59 | 2 | 107 | 2 | 167 | 5  | 229 | 6 |
| 17 | 3 | 61 | 2 | 109 | 6 | 173 | 2  | 233 | 3 |
| 19 | 2 | 67 | 2 | 113 | 3 | 179 | 2  | 239 | 7 |
| 23 | 5 | 71 | 7 | 127 | 3 | 181 | 2  | 241 | 7 |
| 29 | 2 | 73 | 5 | 131 | 2 | 191 | 19 | 251 | 6 |
| 31 | 3 | 79 | 3 | 137 | 3 | 193 | 5  | 257 | 3 |
| 37 | 2 | 83 | 2 | 139 | 2 | 197 | 2  |     |   |
| 41 | 6 | 89 | 3 | 149 | 2 | 199 | 3  |     |   |
| 43 | 3 | 97 | 5 | 151 | 6 | 211 | 2  |     |   |

(A2) Construction of a base sequence c(i) for the intra-row permutation according to:

$$c(i) = [g \cdot c(i-1)] \bmod p, \; i=1, 2, \ldots, (p-2)$$

$$c(0) = 1$$

mod denoting the modulo operation.
   (A3) Search for the set $\{q_j\}$ of the minimum prime numbers, j=1, 2, . . . , R−1, where:

$$ggT\{q_j, p-1\} = 1$$

(ggT=greatest common devisor)
   $q_j > 6$
   $q_j > q_{j-1}$
   $q_0 = 1$
   (A4) The set $\{q_j\}$ is permuted, the set obtained by the permutation is denoted by $\{p_j\}$, and the permutation specification is:

$$p_{Px(j)} = q_j \; j=0, 1, \ldots, R-1,$$

$p_x(j)$ being the inter-row permutation that is defined in the third step.
   (A5) Carrying out the jth intra-row permutation, j=0, 1, . . . , R−1, according to:

$$c_j(i) = c([i \cdot p_j] \bmod (p-1)), \; i=0, 1, 2, \ldots, (p-2) \text{ and}$$

$$c_j(p-1) = 0,$$

$c_j(i)$ being the position of the input bit of the ith output after the permutation of the jth row.
   Case B: C=p+1
   (B1) As case A1
   (B2) As case A2
   (B3) As case A3
   (B4) As case A4
   (B5) carrying out the jth intra-row permutation, j=0, 1, . . . , R−1, according to:

$$c_j(i) = c([i \cdot p_j] \bmod (p-1)), \; i=0, 1, 2, \ldots, (p-2) \text{ and}$$

$$c_j(p-1) = 0, \text{ and}$$

$$c_j(p) = p,$$

(B6) If K=C·R, then exchange $c_{R-1}(p)$ against $C_{R-1}(0)$, $c_j(i)$ being the position of the input bit of the ith output after the permutation of the jth row.

Case C: C=p−1
(C1) As case A1
(C2) As case A2
(C3) As case A3
(C4) As case A4
(C5) Carrying out the jth intra-row permutation, j=0, 1, . . . , R−1, according to:

$$c_j(i)=c([i \cdot p_j]\mod(p-1))-1, i=0, 1, 2, \ldots, (p-2)$$

$c_j(i)$ being the position of the input bit of the ith output after the permutation of the jth row.

3rd Set (Inter-Row Permutation)

Carrying out the inter-row permutation $P_x(j)$, j=0, 1, . . . , R−1, X=A, B, C or D, according to the following schemes, $P_x(j)$ being the original position of the jth permuted row:

$P_A$:{19,9,14,4,0,2,5,7,12,18,10,8,13,17,3,1,16,6,15,11} for R=20

$P_B$:{19,9,14,4,0,2,5,7,12,18,16,13,17,15,3,1,6,11,8,10} for R=20

$P_C$:{9,8,7,6,5,4,3,2,1,0} for R=10

$P_D$:{4,3,2,1,0} for R=5

The various schemes are used as follows:

| Block length K | $P_X$ (j) |
|---|---|
| 40–159 bits | $P_D$ |
| 160–200 bits | $P_C$ |
| 201–480 bits | $P_A$ |
| 481–530 bits | $P_C$ |
| 531–2280 bits | $P_A$ |
| 2281–2480 bits | $P_B$ |
| 2481–3160 bits | $P_A$ |
| 3161–3210 bits | $P_B$ |
| 3211–5114 bits | $P_A$ | where X=A or B or C or D

Figure 4:
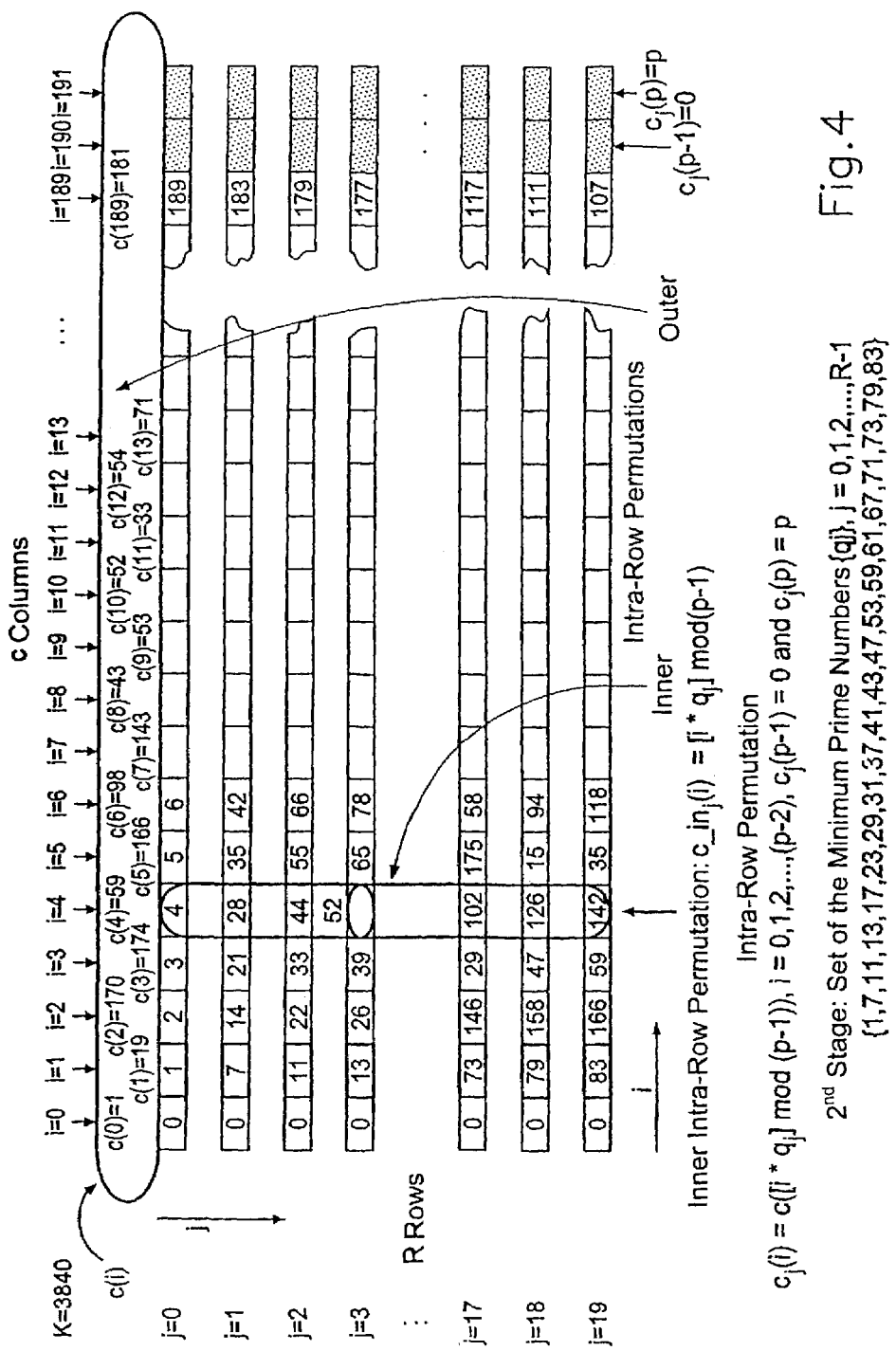
FIG. 4 is an illustration for explaining the intra-row permutation in the generation of an interleaving transformation matrix for K=3840 in the UMTS Standard.

FIG. 4 uses an example for K=3840 to explain the structure of the transformation matrix. In this case, the individual elements of the matrix are identified using their row/column coordinates (j,i), and the coordinate transformations prescribed by the above standard are considered.

In accordance with the definitions under points 1.1 and 1.2, the result is C=192 (number of columns) and R=20 (number of rows). The minimum prime number is p=191.

Case B is valid for the 2nd step. In accordance with step B1, the primitive root g is determined for p=191. The result is g=19.

The base sequence c(i) is calculated in step B2. The calculated values c(i) are specified in FIG. 4 in the horizontal area rimmed in bold.

The set $\{q_j\}$ of the minimum prime numbers, j=0 to R−1, is calculated in step B3. The set of the minimum prime numbers is:

{1,7,11,13,17,23,29,31,37,41,43,47,53,59,61,67,71,73,79,83}

Step B5 is carried out with the set $\{q_j\}$ of the minimum prime numbers in the following example; the transition to the set of the permuted minimum prime numbers is not performed until afterward during the inter-row permutation. Consequently, the associated intra-row permutation is calculated for the jth row using the equation $c_j(i)=c([i \cdot q_j]\mod(p-1))$. Were it to be executed separately on the data symbols in the interleaving input data memory V_iDS, (which is not the case, since it serves only to construct the transformation matrix), the intra-row permutation specification $c_j(i)$ would have the effect that a data symbol read in onto the row/column coordinate (j,i) in the interleaving input data memory V_iDS would be stored at a memory location of a (fictitious) buffer with the row/column coordinate (j,$c_j(i)$).

The intra-row permutation $c_j(i)$ depends on the row index j, that is to say is different for each row.

In accordance with the equation specified in step B5, the intra-row permutation can be carried out as a sequential execution of an "inner" intra-row permutation in accordance with the specification:

$$c\_in_j(i)=[i \cdot q_j]\mod(p-1);$$

and an "outer" intra-row permutation in accordance with the specification:

$$c\_out(i)=c(i).$$

The inner intra-row permutation $c\_in_j(i)$ differs for each row, while the outer intra-row permutation $c\_out(i)$ is identical for all the rows.

Some of the column target coordinate values $c\_in_j(i)$ obtained in the case of the inner intra-row permutation are plotted in the R×C transformation matrix illustrated in FIG. 4. The sequence $\{q_j\}$ of the minimum prime numbers follows for i=1 (1st column).

The values in the column i=4 are rimmed in bold in FIG. 4. They are calculated in accordance with the equation $$c\_in_j(4)=[4 \cdot q_j]\mod 190.$$

The value $c\_in_3(4)=[4 \cdot 13]\mod 190=52$ results for the memory location with the coordinate i=4, j=3.

Figure 5:
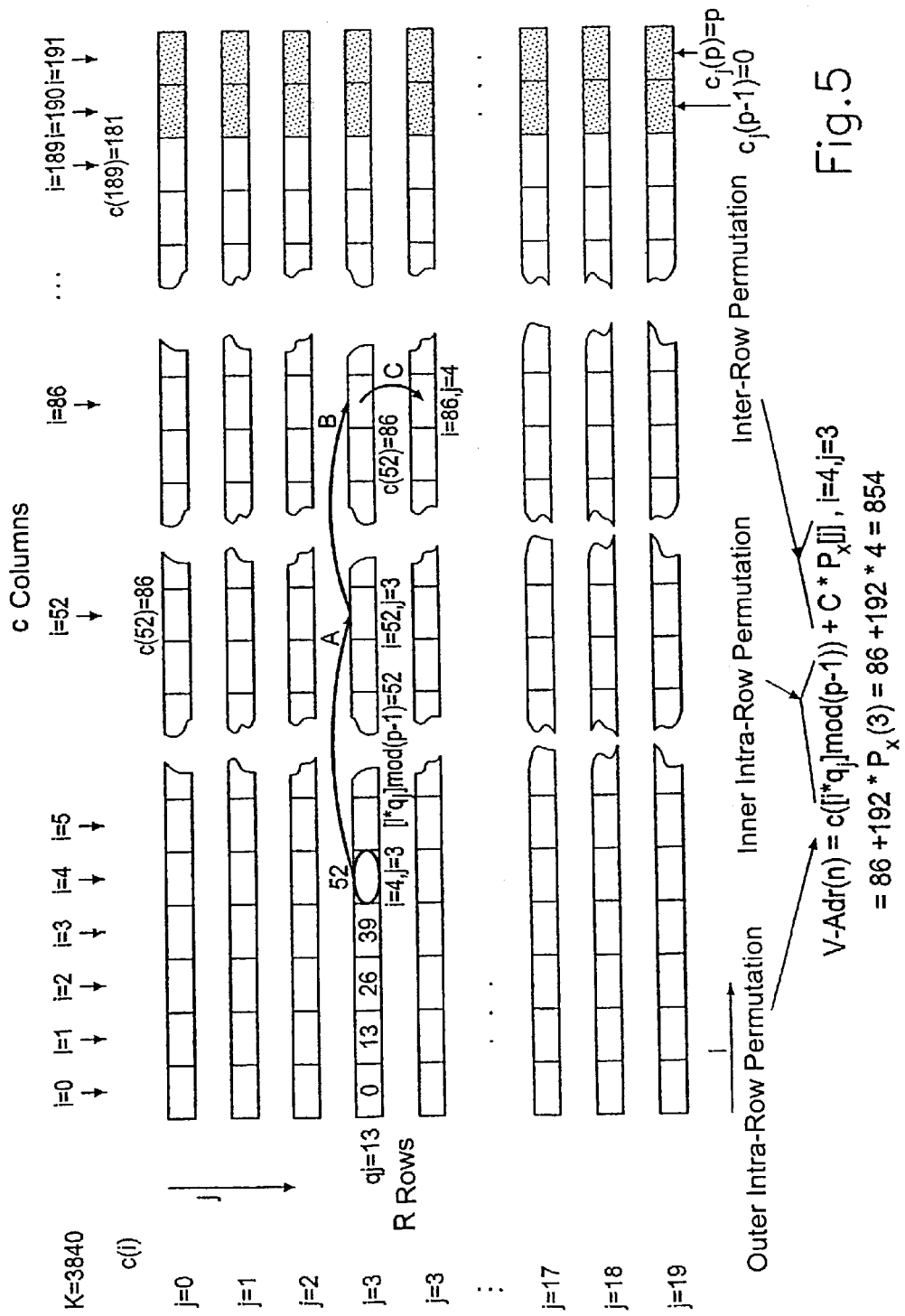
FIG. 5 corresponds to FIG. 4 and illustrates the successive execution of two coordinate transformations for implementing the intra-row permutation and a coordinate transformation for implementing the inter-row permutation in order to generate the UMTS interleaving transformation matrix.

The inner intra-row permutation, which therefore maps the coordinate (3,4) onto the coordinate (3,52), is illustrated in FIG. 5 by the arrow A.

The outer intra-row permutation $c\_out(i)$ is represented by the arrow B. The target coordinate (3,52) of the inner intra-row permutation, which is the output coordinate for the outer intra-row permutation, is mapped onto the target coordinate (3,86) of the outer intra-row permutation (which is therefore also the target coordinate of the overall intra-row permutation).

The result for this example is:

$$c_3(4)=c\_out(c\_in_3(4))=86.$$

The inter-row permutation is executed in accordance with the scheme $P_A$ in the 3rd step. Since $P_A(j=3)=4$, the target coordinate (3,86) of the intra-row permutation is mapped onto the target coordinate (4,86) of the inter-row permutation. The inter-row permutation corresponds to a transfer (not actually taking place) of the data symbol, stored in the memory location of the fictitious buffer with the coordinate (3,86), into the memory location of the interleaving output data memory V_fDS with the coordinate (4,86). The inter-row permutation is illustrated in FIG. 5 by the arrow C.

The UMTT coordinate mapping specification thus results in general for the interleaving:

$$(j,i) \to (P_x(j), c_j(i)).$$

The one-dimensional interleaving target addresses of the permutation matrix P can be calculated from the coordinate mapping specification of the transformation matrix in accordance with the following relationship:

Source address: n=j·C+I; and
Interleaving target address: V-Adr(n)=$P_x(j) \cdot C + c_j(i)$.

The permutation matrix can therefore be calculated in accordance with FIG. 3, upper part.

The result for the example is that:

Source address: n=(3)·(192+4)=580; and

Interleaving target address: V-Adr(579)=(4)·(192+86)=854.

That is to say, the interleaving target address value 854 is present in the permutation matrix P in the field with the address n=580 (corresponding to the coordinate (3,4)).

It is explained below how, in accordance with the invention, the deinterleaving target addresses of the first row of the inverse permutation matrix $P^{-1}$ can be calculated without the need to carry out a calculation of the permutation matrix P in advance.

First, the number of rows and columns of the inverse permutation matrix $P^{-1}$ are determined. The determination is performed in accordance with step 1, that is to say it is identical to the determination of the number of rows and columns of the permutation matrix P.

The coordinates of the inverse permutation matrix $P^{-1}$ are specified in the form (j,i), that is to say likewise as row/column coordinates.

First, the inverse mapping of the inter-row permutation defined in the UMTS Standard, under step 3, is executed. The inverse inter-row permutations $P_x^{-1}(j), j=0,1,\ldots,R-1$ are as follows for the cases X=A, B, C or D:

$P^{-1}_A$: {4,15,5,14,3,6,17,7,11,1,10,19,8,12,2,18,16,13,9,0} for R=20;

$P^{-1}_B$: {4,15,5,14,3,6,16,7,18,1,19,17,8,11,2,13,10,12,9,0} for R=20;

$P^{-1}_C$: {9,8,7,6,5,4,3,2,1,0} for R=10; and $P^{-1}_D$: {4,3,2,1,0} for R=5;

The selection X=A, B, C or D of the inverse inter-row permutation follows from the scheme specified under step 3.

The coordinate mapping specification of the inverse inter-row permutation is:

$$(j,i) \to (P_x^{-1}(j),i).$$

In this case, (j,i) is the output coordinate of a memory location of the deinterleaving input data memory E_iDS.

In a next step, the row coordinate is calculated by successively executing the inverse mappings of the outer intra-row permutation and the inner intra-row permutation.

The coordinate transformation with reference to the inverse outer intra-row permutation is:

$$(P_x^{-1}(j),i) \to (P_x^{-1}(j),c\_out^{-1}(i)).$$

Here, $c\_out^{-1}(i)=c^{-1}(i)$ denotes the inverse outer intra-row permutation.

The inverse inner intra-row permutation is executed in a last coordinate transformation step. The corresponding mapping specification is:

$$(P_x^{-1}(j),c\_out^{-1}(i)) \to (P_x^{-1}(j),c\_in_{P_x^{-1}(j)}^{-1}(c\_out^{-1}(i))).$$

The calculation of the deinterleaving target addresses E-Adr(n) is then performed using the following abbreviations:

$d_i=c\_in_{P_x^{-1}(j)}^{-1}(c\_out^{-1}(i));$ and $d_j=P_x^{-1}(j)$ in accordance with the equation:

$E\text{-Adr}(n)=d_j \cdot C+d_i;$ n=j·C+i being the source address of the interleaved data signal stored in the deinterleaving input data memory E_iDS.

Exceptions to this deinterleaving scheme occur in the case of columns p−1 and p for the case C=p+1 and for the column p−1 for the case C=p.

These columns are not subjected to the intra-row permutation, that is to say in their case, neither the outer intra-row permutation nor the inner intra-row permutation is undertaken. Consequently, the deinterleaving cycle is limited to the inversion of the inter-row permutation.

Only the inter-row permutation is carried out with reference to the column p in the deinterleaving. The result of the deinterleaving is therefore:

$d_i=i=p;$ $d_j=P_x^{-1}(j),$ X=A, B, C or D.

The column p−1 is subjected to the inter-row permutation during the interleaving and then mapped onto the column 0. The result of the deinterleaving cycle is therefore:

$d_i=p-1$ for $i=0;$ $d_j=P_x^{-1}(j)$ X=A or B or C or D.

The calculation of the deinterleaving target addresses is also performed here in accordance with the formula E-Adr(n)=$d_j$·C+$d_i$ already specified.

When carrying out the deinterleaving step, the first step now is to calculate the target deinterleaving addresses E-Adr(n) for a specific prescribed segment of the deinterleaving input data memory E_iDS, for example, in the described example, the deinterleaving addresses n=0,1, . . . , 191 for a specific row j. It is necessary for this purpose to calculate the row coordinate value, value $d_j$ relating to the row index j, and all the column coordinate values $d_i$. The calculated deinterleaving target addresses E-Adr(n) for the row j are stored in the target address memory. For this purpose, in the example considered the latter need have only 192 memory locations, in general at most 256 memory locations, of a word length of, for example 13 bits. The target address memory is to be designed to be correspondingly larger in the case of a data block segment consisting of a plurality of rows.

The first 192 data symbols of the interleaved data signal are then deinterleaved using these 192 target addresses. The cycle corresponds to the mode of procedure explained using FIG. 3.

After the first 192 data symbols (or another freely selectable segment of the interleaved data block) are deinterleaved, the next set of deinterleaving target address values E-Adr(n) is calculated, and the restoring of the data symbols of the second segment considered in the data block is carried out in accordance with the calculated deinterleaving target address values. If deinterleaving is carried out in rows, the data block is completely deinterleaved after R=5 or R=10 or R=20 alternating deinterleaving target address calculating steps, deinterleaving target address storage steps in which the target addresses used in the preceding procedure are overwritten, and data symbol restoring steps. The described method of segmental or sequential deinterleaving of a data signal interleaved in blocks has been explained using turbo deinterleaving in accordance with the UMTS Standard, but is not limited to these conditions, but rather can be used generally as a deinterleaving procedure for data signals interleaved in blocks.

We claim:

1. A method for deinterleaving an interleaved data signal, the method comprises:

obtaining the interleaved data signal from a transmitter, the data signal being interleaved by an interleaver at the transmitter end in blocks in accordance with a prescribed variable interleaving specification obtained from a given generating rule for calculating various interleaving specifications, the generating rule including an inner and an outer intra-row permutation and an inter-row permutation for defining a permutation matrix containing interleaving target addresses, wherein each one of the blocks includes K data symbols;

deinterleaving the interleaved data signal at a receiver end:

without previously calculating the permutation matrix containing interleaving target addresses, calculating deinterleaving target addresses being elements of an inverse permutation matrix for a first prescribed segment of the K data symbols of a data block directly from the given generating rule by the steps of carrying out an inverse inter-row permutation, carrying out an inverse outer intra-row permutation, and carrying out an inverse inner intra-row permutation, and storing the deinterleaving target addresses of the first prescribed segment of the K data symbols in a target address memory;

deinterleaving the first prescribed segment of the K data symbols by accessing a memory for storage of the data symbols with the deinterleaving target addresses stored in the target address memory;

segmentally deinterleaving all remaining segments of the data block by:

a) calculating new deinterleaving target addresses for a next prescribed segment of the K data symbols of the data block directly from the generating rule according to above-mentioned steps, and storing the new deinterleaving target addresses in the target address memory, b) deinterleaving the next segment of the K data symbols of the data block in accordance with the new deinterleaving target addresses stored in the target address memory, and c) repeating steps a) and b) for each one of the remaining segments of the data block to obtain the deinterleaved data signal.

2. The method according to claim 1, wherein the step of storing the new deinterleaving target addresses in the target address memory includes overwriting deinterleaving target addresses that have been previously stored in the target address memory.

3. The method according to claim 1, wherein the step of deinterleaving the first prescribed segment of the K data symbols in accordance with the deinterleaving target addresses stored in the target address memory and the step of segmentally deinterleaving all remaining segments of the data block are steps of a turbo deinterleaving.

4. The method according to claim 1, wherein:

the step of deinterleaving the first prescribed segment of the K data symbols in accordance with the deinterleaving target addresses stored in the target address memory and the step of segmentally deinterleaving all remaining segments of the data block are steps of a turbo deinterleaving; and the data signal has been interleaved using a turbo interleaver.

5. The method according to claim 1, wherein:

the interleaving specification is formed as a coordinate transformation matrix including R rows and C columns;

each prescribed segment of the K data symbols has a number of nz·C consecutive data symbols of the data signal that has been interleaved; and nz is a whole number equal to or greater than 1.

6. The method according to claim 5, wherein nz=1.

* * * * *